US009106048B2

(12) United States Patent
Krishnamoorthy et al.

(10) Patent No.: US 9,106,048 B2
(45) Date of Patent: Aug. 11, 2015

(54) WAVEGUIDE-COUPLED VERTICAL CAVITY LASER

(71) Applicant: Oracle International Corporation, Redwood City, CA (US)

(72) Inventors: Ashok V. Krishnamoorthy, San Diego, CA (US); John E. Cunningham, San Diego, CA (US); Xuezhe Zheng, San Diego, CA (US)

(73) Assignee: ORACLE INTERNATIONAL CORPORATION, Redwood Shores, CA (US)

( * ) Notice: Subject to any disclaimer, the term of this patent is extended or adjusted under 35 U.S.C. 154(b) by 97 days.

(21) Appl. No.: 13/764,223

(22) Filed: Feb. 11, 2013

(65) Prior Publication Data

US 2014/0226684 A1 Aug. 14, 2014

(51) Int. Cl.
| | |
|---|---|
| H01S 5/02 | (2006.01) |
| H01S 5/10 | (2006.01) |
| H01S 5/20 | (2006.01) |
| H01S 5/026 | (2006.01) |
| H01S 5/06 | (2006.01) |
| H01S 5/068 | (2006.01) |
| H01S 5/183 | (2006.01) |

(52) U.S. Cl.
CPC .............. *H01S 5/026* (2013.01); *H01S 5/18358* (2013.01); *H01S 5/021* (2013.01); *H01S 5/0218* (2013.01); *H01S 5/0612* (2013.01); *H01S 5/06804* (2013.01); *H01S 5/1032* (2013.01); *H01S 5/18308* (2013.01); *H01S 5/18341* (2013.01); *H01S 5/2045* (2013.01)

(58) Field of Classification Search
CPC ..... H01S 5/021; H01S 5/0218; H01S 5/2045; H01S 5/1032

USPC .............................................. 372/50.1, 46.01
See application file for complete search history.

(56) References Cited

U.S. PATENT DOCUMENTS

| | | | |
|---|---|---|---|
| 8,502,263 B2 * | 8/2013 | Li et al. .......................... 257/103 |
| 2006/0002443 A1 * | 1/2006 | Farber et al. .................. 372/50.1 |
| 2009/0016399 A1 * | 1/2009 | Bowers ....................... 372/50.21 |
| 2010/0142580 A1 * | 6/2010 | Gilet et al. .................. 372/50.11 |
| 2011/0158278 A1 * | 6/2011 | Koch ........................ 372/45.012 |
| 2011/0235962 A1 * | 9/2011 | Shubin et al. ................... 385/14 |
| 2012/0008658 A1 * | 1/2012 | Chung ........................ 372/45.01 |
| 2013/0188904 A1 * | 7/2013 | Min et al. ......................... 385/14 |
| 2013/0195461 A1 * | 8/2013 | Krishnamoorthy et al. .... 398/82 |
| 2014/0098833 A1 * | 4/2014 | Kim et al. ................. 372/44.011 |

* cited by examiner

*Primary Examiner* — Tod T Van Roy
*Assistant Examiner* — Marcia Golub-Miller
(74) *Attorney, Agent, or Firm* — Park, Vaughan, Fleming & Dowler LLP; Steven E. Stupp (57) ABSTRACT

An integrated circuit includes an optical source that provides an optical signal to an optical waveguide. In particular, the optical source may be implemented by fusion-bonding a III-V semiconductor to a semiconductor layer in the integrated circuit. In conjunction with surrounding mirrors (at least one of which is other than a distributed Bragg reflector), this structure may provide a cavity with suitable optical gain at a wavelength in the optical signal along a vertical direction that is perpendicular to a plane of the semiconductor layer. For example, the optical source may include a vertical-cavity surface-emitting laser (VCSEL). Moreover, the optical waveguide, defined in the semiconductor layer, may be separated from the optical source by a horizontal gap in the plane of the semiconductor layer. During operation of the optical source, the optical signal may be optically coupled across the gap from the optical source to the optical waveguide.

16 Claims, 5 Drawing Sheets

WAVEGUIDE-COUPLED VERTICAL CAVITY LASER

GOVERNMENT LICENSE RIGHTS

This invention was made with Government support under Agreement No. HR0011-08-9-0001 awarded by DARPA. The Government has certain rights in the invention.

BACKGROUND

1. Field

The present disclosure relates to techniques for communicating optical signals. More specifically, the present disclosure relates to an integrated circuit that includes an optical source.

2. Related Art

Silicon photonics is a promising technology that can provide large communication bandwidth, low latency and low power consumption for inter-chip and intra-chip connections. In the last few years, significant progress has been made in developing low-cost components for use in inter-chip and intra-chip silicon-photonic connections, including: high-bandwidth efficient silicon modulators, low-loss optical waveguides, wavelength-division-multiplexing (WDM) components, and high-speed CMOS optical-waveguide photodetectors. However, producing a suitable low-cost WDM optical source remains a challenge and poses an obstacle to implementing WDM silicon-photonic links. For example, conventional WDM laser sources: have very low wall-plug efficiency (typically, 1-5%), require cooling, and are bulky and expensive.

Hence, what is needed is an integrated optical source without the above-described problems.

SUMMARY

One embodiment of the present disclosure provides an integrated circuit that includes an optical source which provides an optical signal having a wavelength. This optical source includes: a semiconductor layer with a region having a top surface and a bottom surface; a material having a top surface and a bottom surface, where the bottom surface of the material is disposed on the top surface of the region, and the material has an optical gain at the wavelength that is larger than that of the semiconductor layer; a first mirror, which is other than a reflector that includes multiple layers with alternating indices of refraction, disposed under the bottom surface of the region; and a second mirror disposed on the top surface of the material, where the first mirror, the second mirror, the region and the material define an optical cavity out of a plane of the semiconductor layer. Moreover, the integrated circuit includes an optical waveguide defined in the semiconductor layer.

For example, the semiconductor layer may include silicon. Moreover, the material may include a III-V semiconductor, such as indium-phosphide. This material may be fusion-bonded to the semiconductor layer.

Note that a given mirror, which can be the first mirror or the second mirror, may include a stack, out of the plane of the semiconductor layer, of alternating materials having a first index of refraction and a second index of refraction that is higher than the first index of refraction. Furthermore, the first mirror and the second mirror may each have a reflectivity at the wavelength in excess of 99%.

Additionally, the optical source may include a vertical-cavity surface-emitting laser (VCSEL).

In some embodiments, the material includes regions with dopants proximate to edges of the material in the plane of the semiconductor layer that define a current aperture for charge carriers in the optical source out of the plane of the semiconductor layer. Moreover, the integrated circuit may include intra-optical-cavity electrical contacts which conduct charge carriers that provide a current out of the plane of the semiconductor layer in the optical source. Additionally, the integrated circuit may include a layer of another material between the top surface of the region and the bottom surface of the material, where, during operation of the optical source, the other material restricts current out of the plane of the semiconductor layer from the semiconductor layer to the material. For example, the other material may include n-type indium-phosphide.

Furthermore, the integrated circuit may include: a semiconductor substrate, and a buried-oxide layer having a bottom surface and a top surface, where the bottom surface of the buried-oxide layer is disposed on top of the semiconductor substrate, and the bottom surface of the semiconductor layer is disposed on the top surface of the buried-oxide layer. Additionally, the semiconductor substrate may have been removed under the region so that the first mirror is disposed on the bottom surface of the buried-oxide layer. Note that the semiconductor substrate, the buried-oxide layer and the semiconductor layer may constitute a silicon-on-insulator technology.

In some embodiments, the integrated circuit includes a heater, defined in the semiconductor layer, which thermally tunes the wavelength of the optical source.

Moreover, the integrated circuit may include a diffraction grating, defined in the region, which optically couples the optical signal in the plane of the semiconductor layer to the optical waveguide. This diffraction grating may include an electro-optic material that electrically tunes the wavelength of the optical source.

Note that the optical waveguide may be separated by a gap in the plane of the semiconductor layer that is defined by an edge of the region and an edge of the optical waveguide. Therefore, the optical waveguide may receive the optical signal from the optical source via optical coupling across the gap. Moreover, the edge of the optical waveguide may be proximate to the edge of the region so that, during operation of the optical source, the optical signal is evanescently coupled to the optical waveguide.

Another embodiment provides a system that includes the integrated circuit.

Another embodiment provides a method for providing the optical signal having the wavelength, which may be performed by the integrated circuit. During operation of the integrated circuit, charge carriers are injected into the optical source in the integrated circuit, where the optical source includes the optical cavity out of the plane of the semiconductor layer in the integrated circuit, and where the optical cavity includes: the region in the semiconductor layer, the material disposed on the top surface of the region having the optical gain at the wavelength that is larger than that of the semiconductor layer, and mirrors below the semiconductor layer and above the material (where at least one of the mirrors is other than a reflector that includes multiple layers with alternating indices of refraction). Then, the optical signal produced in the optical source is optically coupled to the optical waveguide, defined in the semiconductor layer, which is separated by the gap in the plane of the semiconductor layer that is defined by the edge of the region and the edge of the optical waveguide.

BRIEF DESCRIPTION OF THE FIGURES

Note that like reference numerals refer to corresponding parts throughout the drawings. Moreover, multiple instances of the same part are designated by a common prefix separated from an instance number by a dash.

DETAILED DESCRIPTION

Embodiments of an integrated circuit, a system that includes the integrated circuit, and a technique for providing an optical signal are described. The integrated circuit includes an optical source that provides the optical signal to an optical waveguide. In particular, the optical source may be implemented by fusion-bonding a III-V semiconductor to a semiconductor layer in the integrated circuit. In conjunction with surrounding mirrors (at least one of which is other than a distributed Bragg reflector and, more generally, a reflector that includes multiple layers with alternating indices of refraction), this structure may provide a cavity with suitable optical gain at a wavelength in the optical signal along a vertical direction that is perpendicular to a plane of the semiconductor layer. For example, the optical source may include a vertical-cavity surface-emitting laser (VCSEL). Moreover, the optical waveguide, defined in the semiconductor layer, may be separated from the optical source by a horizontal gap in the plane of the semiconductor layer. During operation of the optical source, the optical signal may be optically coupled across the gap from the optical source to the optical waveguide.

By combining the optical source and the optical waveguide, the integrated circuit may provide a low-cost, compact, energy-efficient WDM optical source for use in inter-chip and intra-chip connections, such as WDM silicon-photonic links. Consequently, the optical source may help facilitate high-speed inter- and intra-chip silicon-photonic interconnects, as well as associated systems that can include this component (such as high-performance computing systems).

We now describe embodiments of the integrated circuit. The electrical-to-optical conversion efficiency of a WDM optical source is a major contributor to the energy efficiency of a silicon-photonic link. For example, if a silicon-photonic link uses a minimum of 2 mW of input light (before an optical modulator), and the electrical-to-optical conversion efficiency is 10% (which is optimistic relative to the 1-5% electrical-to-optical conversion efficiency of many existing optical sources), then 20 mW of electrical power will be needed just to create the required input light (i.e., not including the power consumed by the remainder of the silicon-photonic link). This power consumption can be reduced by improving the conversion efficiency of the optical source and by decreasing the optical losses that occur when light is input to the silicon-photonic link. The former approach is described below.

Figure 1:
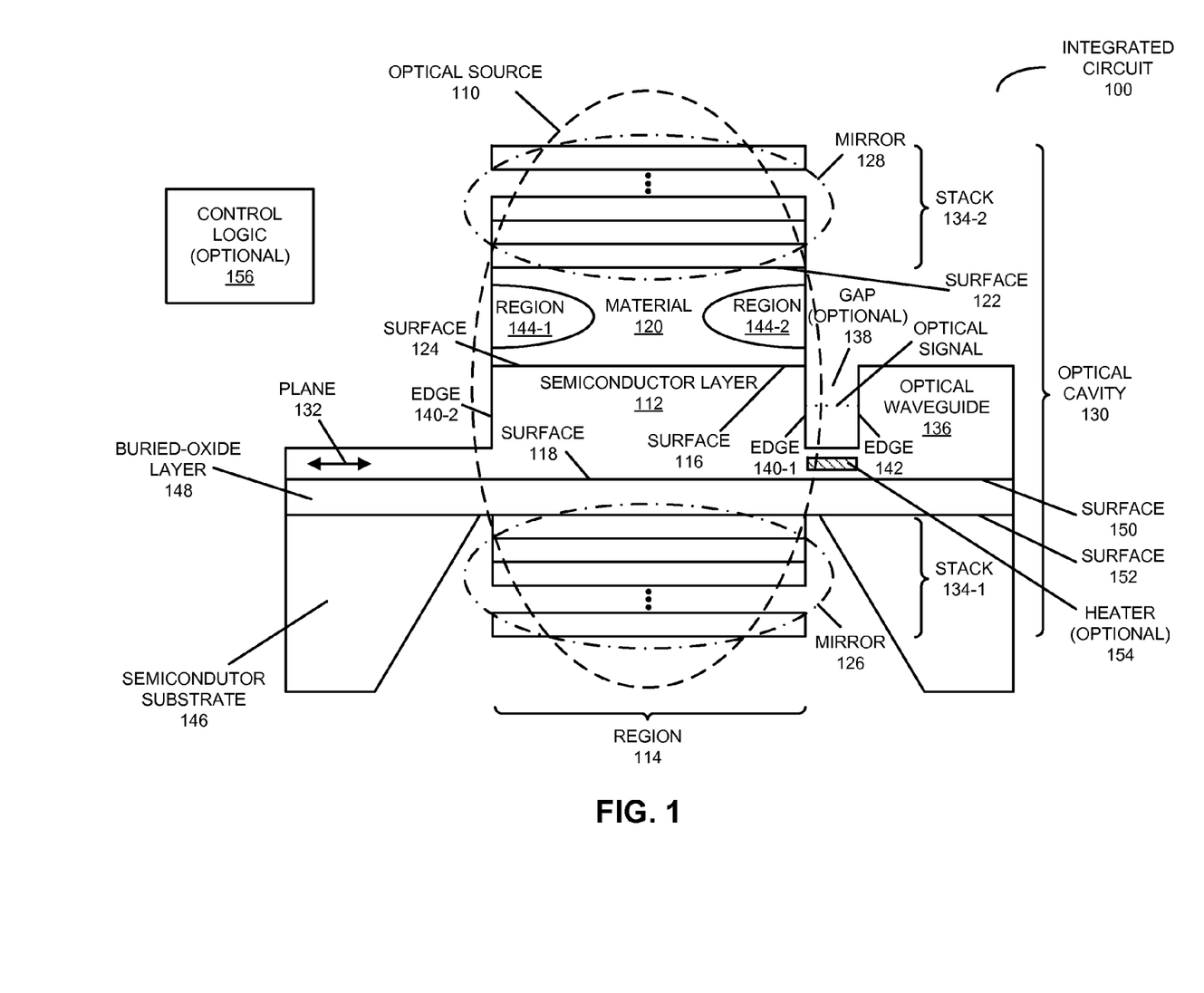
FIG. 1 is a block diagram of a side view of an integrated circuit in accordance with an embodiment of the present disclosure.

FIG. 1 presents a block diagram of a side view of integrated circuit 100 that includes an electrically injected semiconductor laser device, such as optical source 110, which provides an optical signal having a wavelength λ (such as a fundamental wavelength or a carrier wavelength). This optical source includes: a semiconductor layer 112 (such as silicon) with a region 114 having a surface 116 and a surface 118; a material 120 having a surface 122 and a surface 124, where surface 124 of material 120 is disposed on surface 116, and material 120 has an optical gain at λ that is larger than that of semiconductor layer 112; a mirror 126 disposed under surface 118; and a mirror 128 disposed on surface 122. Note that material 120 may include a III-V semiconductor, such as indium-phosphide. This material may be fusion-bonded or hybrid-bonded to semiconductor layer 112 (for example, using an oxide, such as silicon dioxide, or a hydrophobic bond) because growth of the gain medium directly on silicon may be difficult due to lattice mismatch. Alternatively, material 120 may include germanium that is directly grown in silicon, and doping and/or stress layers may be used to create a direct bandgap material. Moreover, mirror 126, mirror 128, region 114 and material 120 may define an optical cavity 130 out of a plane 132 of semiconductor layer 112. For example, optical source 110 may include a vertical-cavity surface-emitting laser (VCSEL). This structure is sometimes referred to as a 'hybrid laser'.

Note that a given mirror, which can be mirror 126 or mirror 128, may include a stack (such as one of stacks 134), out of plane 132, of alternating materials having a first index of refraction and a second index of refraction that is higher than the first index of refraction. For example, mirrors 126 and 128 may include a dielectric stack with alternating layers of zinc selenide and silicon dioxide, which may each be 100-500 nm thick. For mirror 128, these layers may be epitaxially deposited on indium-phosphide. In some embodiments, mirrors 126 and 128 include a distributed Bragg reflector or a high-contrast grating implemented in indium-phosphide. Furthermore, mirrors 126 and 128 may each have a reflectivity at λ in excess of 99%, such as 99.9%.

Additionally, integrated circuit 100 includes an optical waveguide 136 (such as a ridge type or a wire type of optical waveguide), defined in semiconductor layer 112, which is separated by an optional gap 138 in plane 132 that is defined by an edge 140-1 of region 114 and an edge 142 of optical waveguide 136, where optical waveguide 136 receives the optical signal from optical source 110 via optical coupling across optional gap 138. For example, edge 142 may be proximate to edge 140-1 so that, during operation of optical source 110, the optical signal is evanescently coupled to optical waveguide 136. Therefore, the primary output coupler for optical source 110 may be optical waveguide 136 (as opposed to via surface emission). This structure is sometimes referred to as a 'waveguide-coupled vertical-cavity laser' or 'waveguide-coupled VCSEL.'

Note that the length of optical cavity 130 may be tuned (for example, by stopping etching on atomic layer using an etch stop) for correct emission and so that the optical waveguide 136 is proximate to a node (with high-intensity) in the optical standing wave within optical cavity 130. Furthermore, optional gap 138 may have a width so that the optical coupling to optical source 110 is approximately 1%. For example, optional gap 138 may be less than 100 nm (such as 50 nm).

In an exemplary embodiment, optical source 110 has a wall-plug efficiency (defined as the ratio of the output light power to the input electrical power) of at least 10-20% at λ of 1550 nm. This is a significant improvement relative to existing WDM optical sources for use in silicon photonics.

In some embodiments, material 120 includes regions 144 with implanted dopants (such as aluminum or hydrogen) and/or an oxide(s) proximate to edges 140 in plane 132 that define a current (or electrical) aperture for charge carriers in optical source 110 out of plane 132. This current aperture may increase the current density, and may control the current flow so as to maximally overlap the charge carriers with the optical field, thereby improving the efficiency of the electrical-to-optical conversion. For example, the current aperture may have a width of 5-10 μm, while optical cavity 130 may have a width of 10-50 μm.

Figure 2:
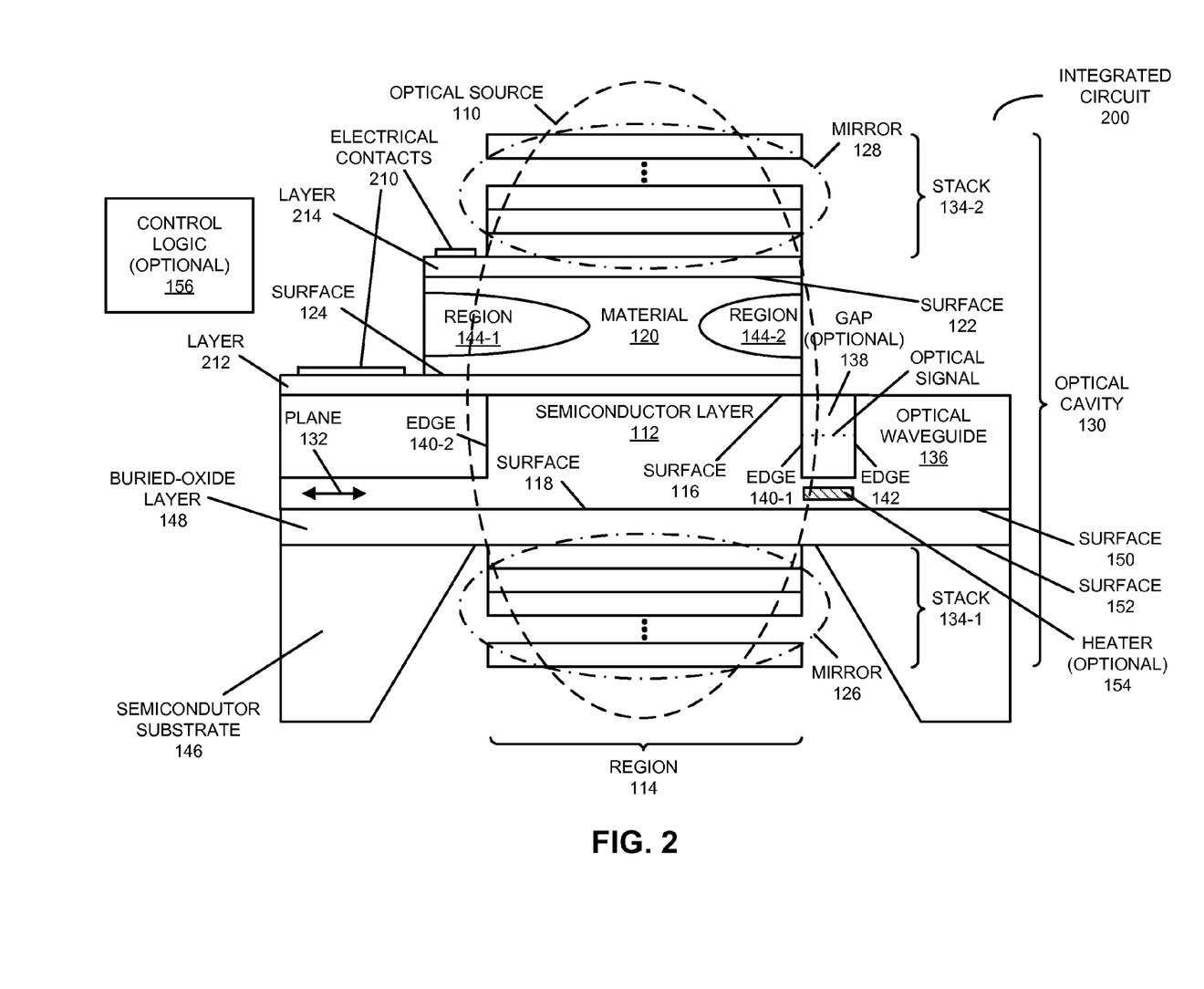
FIG. 2 is a block diagram of a side view of an integrated circuit in accordance with an embodiment of the present disclosure.

Because optical source 110 typically is electrically driven, electrical contacts may be defined on the p and n sides. This is shown in FIG. 2, which presents a block diagram of a side view of integrated circuit 200. In particular, intra-optical-cavity electrical contacts 210 may conduct charge carriers that provide a current out of plane 132 in optical source 110. These electrical contacts may facilitate direct access to the gain medium in material 120, without having to travel through mirrors 126 and 128. In addition, the use of intra-optical-cavity electrical contacts 210 for both the p and n sides of optical source 110 may simplify the construction and may allow the broadest range of materials to be used for mirrors 126 and 128 (including deposited dielectric mirrors that may not be doped for improved conductivity). Note that, in integrated circuit 200, optional gap 138 may be filled with silicon dioxide.

While material 120 may be fusion-bonded to semiconductor layer 112 using silicon dioxide, in other embodiments integrated circuit 200 includes a layer 212 of another material between surfaces 116 and 124 and/or a layer 214 of the other material on top of surface 122. During operation of optical source 110, the other material may restrict current out of plane 132 from semiconductor layer 112 to material 120. For example, the other material may include n-type indium-phosphide. Thus, the current may be confined to material 120, while optical cavity 130 may include material 120, layer 212, layer 214, and semiconductor layer 112. Thus, layer 212 may decouple the electrical and optical portions of optical source 110.

Referring back to FIG. 1, in some embodiments integrated circuit 100 is implemented entirely in a III-V semiconductor material. In this case, mirrors 126 and 128: may be grown epitaxially, may be deposited, or may include a high-contrast grating. Alternatively, as shown in FIG. 1, in some embodiments integrated circuit 100 includes: a semiconductor substrate 146 (such as silicon), and a buried-oxide layer 148 (such as silicon dioxide) having a surface 150 and a surface 152, where surface 152 is disposed on top of semiconductor substrate 146, and surface 118 is disposed on surface 150. Additionally, as shown in FIG. 1, semiconductor substrate 146 may have been removed under region 114 so that mirror 126 is disposed on surface 152 in a back-side etch pit. Note that semiconductor substrate 146, buried-oxide layer 148 and semiconductor layer 112 may constitute a silicon-on-insulator technology. In some embodiments, the silicon in semiconductor layer 112 has a thickness of λ/2 (for example, a thickness of 0.775 μm), buried-oxide layer 148 has a thickness of λ/4 (such as approximately 0.4 μm), and optical cavity 130 may have a total length of 2λ (for example, 3.1 μm).

The ability to integrate optical source 110 with optical waveguide 136 using silicon-on-insulator technology may allow wavelength-filtering elements or components to be defined in optical waveguide 136 using: vertically etched gratings, horizontally etched gratings (e.g., a corrugated-grating bus optical waveguide), and/or ring resonators. These components can be used to achieve wavelength selectivity in the output optical signal. This may effectively narrow the range of acceptable lasing wavelengths by having an output coupler that is wavelength-dependent and controllable in silicon. Therefore, this technique may combine a wavelength-selective laser (such as a laser with a distributed Bragg reflector or a distributed feed-back laser) with the efficiency and ease of fabrication of a VCSEL.

Note that, in order to allow wafer testing of optical source 110, mirrors 126 and/or 128 may be tuned to emit a very small amount of light via surface-normal emission. For example, a mirror with 99.9% reflectivity would allow some light to escape through the surface to facilitate wafer-scale testing of the devices before dicing the wafer and to monitor the emission during operation to determine and continuously assess the health of optical source 110.

The particular λ of emission from optical source 110 (such as a laser) is a function of its junction temperature. Even though the gain medium (i.e., material 120), the resonator geometry (i.e., optical cavity 130) and the grating-based bus waveguide output coupler (i.e., optical waveguide 136) can all be used to help set λ, this selected λ may still be subject to thermal drift. Thus, the specific emission λ from optical source 110 may fluctuate depending on the temperature of integrated circuit 100. However, by controlling the temperature of the laser and the silicon waveguide/wavelength filter that couples out the light, λ can be controlled. Therefore, in some embodiments, integrated circuit 100 includes an optional heater 154, defined in semiconductor layer 112, which thermally tunes λ of optical source 110. For example, optional control logic 156 (which may be a circuit implemented in silicon) may adjust optional heater 154 in a wavelength-based feedback loop. To facilitate feedback control, integrated circuit 100 may include an optional wavelength sensor (not shown) or an interface (not shown) which receives information from an optional external wavelength sensor.

Note that temperature-based tuning of multiple waveguide-coupled vertical-cavity lasers may allow a dense array of single λ optical signals to be provided for WDM applications with localized thermal control of the individual λs. In this way, the λs can be stabilized during operation of the waveguide-coupled vertical-cavity lasers. For example, the heaters may be used to adjust the temperatures of the optical sources and/or their associated optical waveguides to maintain targeted temperature differences (or temperature gradients) and, thus, targeted wavelength differences (or wavelength spacings) between the output-coupled λs in the array. This temperature-based tuning may allow corrections to be applied for chip-level or environmental temperature perturbations. In some embodiments, optional heater 154 may be used to adjust the temperature of a spare waveguide-coupled vertical-cavity laser to tune λ to be that of a failed laser in an array. Another application of this thermal-tuning technique is one-bit-per-wavelength encoding.

In certain operating conditions, the absolute wavelength range of an array of waveguide-coupled vertical-cavity lasers may experience drift. For example, this can occur if the ambient temperature changes or if there is a global change in the temperature of the chip substrate. In this situation, active thermal management of λ can still produce and maintain a correct wavelength spacing between the λs as long as the chip does not experience thermal runaway, and as long as the temperature dependence of the laser λs remains in the linear region. In some embodiments, thermal runaway can be mitigated if active cooling (not shown) is used to control and maintain the temperature of the chip substrate.

Figure 3:
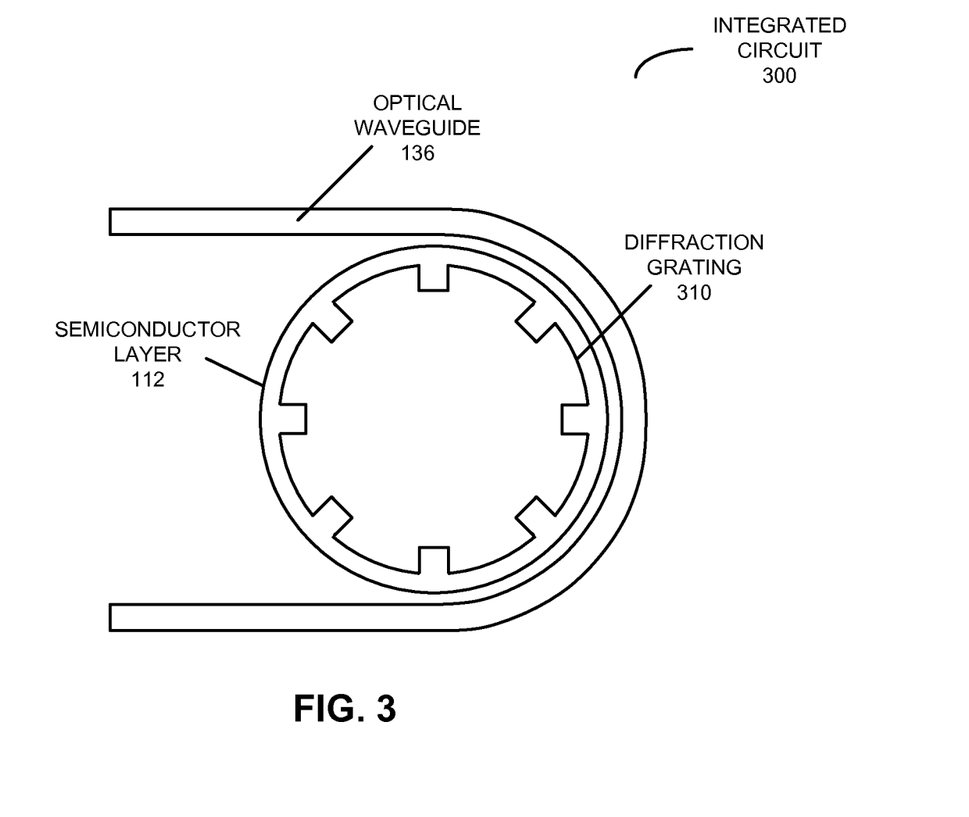
FIG. 3 is a block diagram of a top view of an integrated circuit in accordance with an embodiment of the present disclosure.

In order to horizontally couple the optical signal from optical source 110 to optical waveguide 136, a diffraction grating may be included in optical cavity 130. This is shown in FIG. 3, which presents a block diagram of a top view of integrated circuit 300. In particular, a diffraction grating 310 may be defined in region 114 (FIG. 1), for example, using periodic angular slots in semiconductor layer 112. This diffraction grating may include an optional electro-optic material (such as in the angular slots) that can be used to electrically tune of the optical source in integrated circuit 300. In some embodiments, diffraction grating 310 has a wide of 300-500 nm.

In an exemplary embodiment, optical waveguide 136 may be a semi-circular optical waveguide or an annular ring around the node of the optical mode in optical source 130. This configuration may leverage the azimuthal symmetry in cylindrical coordinates of optical source 130 even though it may be single mode. In particular, by including a sub-wavelength diffraction grating on the circumference of a silicon disk in optical source 110 (FIG. 1), the vertical mode may be perturbed and optical coupled to optical waveguide 136 or an annular circular output coupler in the horizontal plane. This grating perturbation may overcome the orthogonal momentum vectors to optically couple the optical signal to optical waveguide 136.

In an exemplary embodiment, the optical source addresses challenges associated with VCSELs at long wavelengths (e.g. 1.55 μm or C-band), including the non-availability of good-quality, (>99%) high-reflectivity mirrors that are needed to create a short-length vertical cavity lasers. In particular, while epitaxial mirrors at such long wavelengths are often hard to produce, typically at least one of the mirrors for any long-wavelength structure needs to be epitaxial. Furthermore, even if such a VCSEL can be produced, the coupling of the light into a silicon-on-insulator optical waveguide is usually not straightforward. For example, a grating coupler typically cannot efficiently accept surface-normal light into an optical waveguide. Therefore, the VCSEL is usually tilted at a specific angle which is difficult to package and manufacture at low-cost. In addition, edge coupling of light from a VCSEL into an optical waveguide is often difficult (lossy) for sub-micron optical waveguides, and is also not straightforward to manufacture at low-cost.

The optical source addresses these problems by providing a structure in which a vertical-cavity laser is directly edge coupled into an optical waveguide. In this structure, the bottom mirror of the optical source may be below the buried-oxide layer. This buried-oxide layer typically has a precise thickness and the silicon above the buried-oxide layer may also be precisely controlled to an accuracy of a few percent (e.g., for 250-nm thick silicon-on-insulator provides a precision level of 10 nm, which is sufficient given the wavelength of light of 1550 nm). Additional details on wafer and silicon-on-insulator thickness variations and statistics are in A. V. Krishnamoorthy et al., "Exploiting CMOS manufacturing to reduce tuning requirements for resonant optical devices," IEEE Photonics Journal, Vol. 3, No. 3, pp. 567-579, June 2011, the contents of which are hereby incorporated by reference. Note that the thickness of the wafer is typically not controlled to this level of accuracy. However, as is known in the art, the buried-oxide layer (typically, silicon dioxide) forms a good etch stop for a chemical etch of the substrate. Therefore, the thickness accuracy of the silicon-on-insulator and the buried-oxide layer can be used to help define the optical cavity, and the backside of the silicon substrate can be removed to expose the buried-oxide layer. Once the buried-oxide layer is exposed, a high-reflectivity mirror (e.g., metal mirror) can be deposited directly on the back side of the substrate underneath the buried-oxide layer.

The top mirror can be formed epitaxially together with the gain material (this may be a half-laser gain material). This fabrication approach may be easier than growing the full VCSEL structure with two epitaxial Bragg mirrors. However, in an exemplary embodiment, a semiconductor gain material (e.g., a III-V gain material such as InP, or a Group IV gain material such as doped, strained Ge) may be usedm and a mirror may be deposited on top of the gain material for the top mirror (along with the metal bottom mirror) so that no epitaxial Bragg mirrors (or distributed Bragg reflectors), and more generally reflectors that include multiple layers with alternating indices of refraction, need to be grown. For example, the deposited mirror may be a dielectric mirror or a combination of a dielectric mirror followed by a metal 'cap; to ensure very high reflectivity. Note that such a dielectric mirror may also be much thinner than an epitaxial Bragg mirror (i.e., it may need far fewer pairs). This may provide a packaging advantage because the resulting topology of the optical source is reduced (i.e., flatter).

In an alternate embodiment, a dielectric mirror (with or without metal) can be used for both top mirror (above the gain material) and the bottom mirror (beneath the buried-oxide layer). These types of dielectric mirrors are known in the art.

Figure 4:
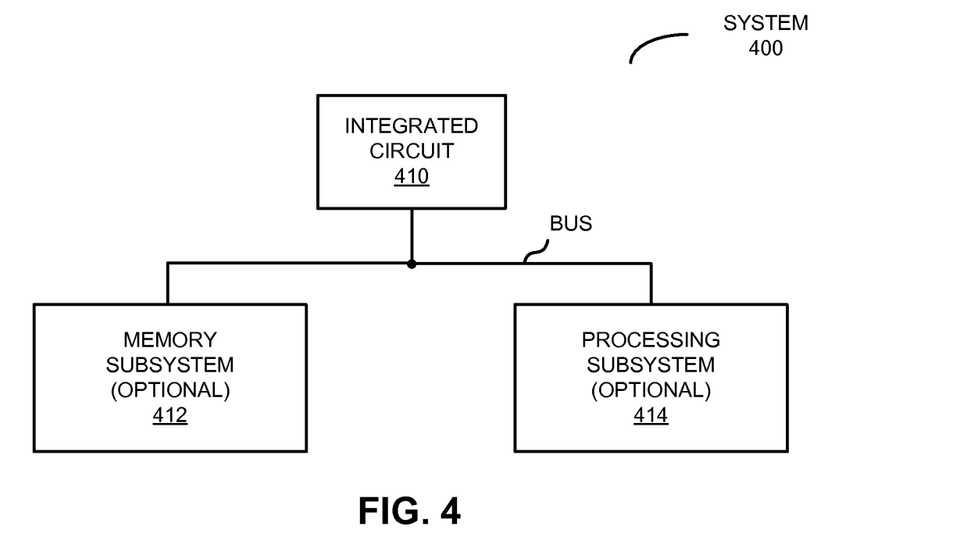
FIG. 4 is a block diagram illustrating a system that includes an integrated circuit in accordance with an embodiment of the present disclosure.

One or more of the preceding embodiments of the integrated circuit may be included in a system and/or an electronic device. FIG. 4 presents a block diagram illustrating a system 400 that includes an integrated circuit 410.

In general, functions of integrated circuit 100 (FIG. 1), integrated circuit 200 (FIG. 2), integrated circuit 300 (FIG. 3) and system 400 may be implemented in hardware and/or in software. Thus, system 400 may include one or more program modules or sets of instructions stored in an optional memory subsystem 412 (such as DRAM or another type of volatile or non-volatile computer-readable memory), which may be executed by an optional processing subsystem 414. Note that the one or more computer programs may constitute a computer-program mechanism. Furthermore, instructions in the various modules in optional memory subsystem 412 may be implemented in: a high-level procedural language, an object-oriented programming language, and/or in an assembly or machine language. Note that the programming language may be compiled or interpreted, e.g., configurable or configured, to be executed by the processing subsystem.

Components in system 400 may be coupled by signal lines, links or buses. These connections may include electrical, optical, or electro-optical communication of signals and/or data. Furthermore, in the preceding embodiments, some components are shown directly connected to one another, while others are shown connected via intermediate components. In each instance, the method of interconnection, or 'coupling,' establishes some desired communication between two or more circuit nodes, or terminals. Such coupling may often be accomplished using a number of circuit configurations, as will be understood by those of skill in the art; for example, AC coupling and/or DC coupling may be used.

In some embodiments, functionality in these circuits, components and devices may be implemented in one or more: application-specific integrated circuits (ASICs), field-programmable gate arrays (FPGAs), and/or one or more digital signal processors (DSPs). Furthermore, functionality in the preceding embodiments may be implemented more in hardware and less in software, or less in hardware and more in software, as is known in the art. In general, system 400 may be at one location or may be distributed over multiple, geographically dispersed locations.

System 400 may include one of a variety of devices that can include an integrated circuit, including: a VLSI circuit, a switch, a hub, a bridge, a router, a communication device or system (such as WDM communication system), a storage area network, a data center, a network (such as a local area network), a computer system (such as a multiple-core processor computer system), a desktop or personal computer, a server (such as a multi-socket, multi-rack server), a work station, a mainframe computer, a blade, an enterprise computer, a supercomputer, a network-attached-storage (NAS) system, a storage-area-network (SAN) system, a laptop computer, a media player (such as an MP3 player), an appliance, a subnotebook/netbook, a tablet computer, a smartphone, a cellular telephone, a network appliance, a set-top box, a personal digital assistant (PDA), a toy, a controller, a digital signal processor, a game console, a device controller, a computational engine within an appliance, a consumer-electronic device, a portable computing device or a portable electronic device, a personal organizer, and/or another electronic device.

The preceding embodiments may include fewer components or additional components. For example, in FIG. 1 semiconductor layer 112 may include poly-silicon or amorphous silicon and/or semiconductor substrate 146 may include multiple substrates in a multi-chip module (such as a multi-chip module in which alternating facing chips that include routing and bridge layers are coupled using optical proximity communication). Furthermore, a wide variety of fabrication techniques may be used to fabricate the optical source in the preceding embodiments of the integrated circuit, as is known to one of skill in the art. In addition, a wide variety of optical components may be used in or in conjunction with the optical source. While thermal tuning of optical source 110 (FIG. 1) was used as an illustrative example, in other embodiments carrier-based index modulation may be used in conjunction with or instead of thermal tuning Although these embodiments are illustrated as having a number of discrete items, the embodiments of the integrated circuit and the system are intended to be functional descriptions of the various features that may be present rather than structural schematics of the embodiments described herein. Consequently, in these embodiments two or more components may be combined into a single component, and/or a position of one or more components may be changed.

While the preceding embodiments illustrate the use of the optical source in the integrated circuit in conjunction with an optical link, the optical source may be used in applications other than communications, such as: manufacturing (cutting or welding), a lithographic process, data storage (such as an optical-storage device or system), medicine (such as a diagnostic technique or surgery), a barcode scanner, entertainment (a laser light show), and/or metrology (such as precision measurements of distance).

In the preceding description, we refer to 'some embodiments.' Note that 'some embodiments' describes a subset of all of the possible embodiments, but does not always specify the same subset of embodiments.

Figure 5:
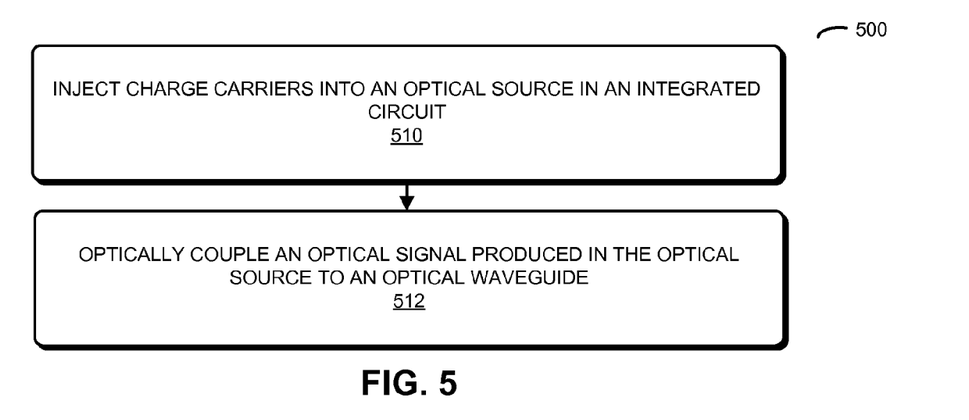
FIG. 5 is a flow chart illustrating a method for providing an optical signal in accordance with an embodiment of the present disclosure.

We now describe embodiments of the method. FIG. 5 presents a flow chart illustrating a method 500 for providing an optical signal having a wavelength, which may be performed using one of the embodiments of the integrated circuit. During operation of the integrated circuit, charge carriers are injected into the optical source in the integrated circuit (operation 510), where the optical source includes the optical cavity out of the plane of the semiconductor layer in the integrated circuit, and where the optical cavity includes: the region in the semiconductor layer, the material disposed on the top surface of the region having the optical gain at the wavelength that is larger than that of the semiconductor layer, and mirrors below the semiconductor layer and above the material (wherein at least one of the mirrors is other than a distributed Bragg reflector and, more generally, a reflector that includes multiple layers with alternating indices of refraction). Then, the optical signal produced in the optical source is optically coupled to the optical waveguide (operation 512) defined in the semiconductor layer.

In some embodiments of method 500, there may be additional or fewer operations. Moreover, the order of the operations may be changed, and/or two or more operations may be combined into a single operation.

The foregoing description is intended to enable any person skilled in the art to make and use the disclosure, and is provided in the context of a particular application and its requirements. Moreover, the foregoing descriptions of embodiments of the present disclosure have been presented for purposes of illustration and description only. They are not intended to be exhaustive or to limit the present disclosure to the forms disclosed. Accordingly, many modifications and variations will be apparent to practitioners skilled in the art, and the general principles defined herein may be applied to other embodiments and applications without departing from the spirit and scope of the present disclosure. Additionally, the discussion of the preceding embodiments is not intended to limit the present disclosure. Thus, the present disclosure is not intended to be limited to the embodiments shown, but is to be accorded the widest scope consistent with the principles and features disclosed herein.

What is claimed is:

1. An integrated circuit, comprising:
a hybrid laser configured to provide an optical signal having a wavelength, wherein the hybrid laser includes:
a semiconductor layer including a region having a top surface and a bottom surface, wherein the semiconductor layer includes silicon;
a material having a top surface and a bottom surface, wherein the bottom surface of the material is disposed on the top surface of the region, wherein the material includes a III-V semiconductor,
and wherein the material has an optical gain at the wavelength that is larger than that of the semiconductor layer;
a first mirror disposed under the bottom surface of the region;
a second mirror disposed on the top surface of the material, wherein the first and the second mirror, includes a stack, out of the plane of the semiconductor layer, of alternating materials having a first index of refraction and a second index of refraction that is higher than the first index of refraction, and wherein the first mirror, the second mirror, the region and the material define an optical cavity out of a plane of the semiconductor layer;
an optical waveguide defined in the semiconductor layer;
a semiconductor substrate; and
a buried-oxide layer having a bottom surface and a top surface, wherein the bottom surface of the buried-oxide layer is disposed on top of the semiconductor substrate, wherein the bottom surface of the semiconductor layer is disposed on the top surface of the buried-oxide layer, and
wherein the semiconductor substrate is removed under the region so that the first mirror is disposed on the bottom surface of the buried-oxide layer;

wherein the semiconductor substrate, the buried-oxide layer and the semiconductor layer constitute a silicon-on-insulator technology.

2. The integrated circuit of claim 1, wherein the material includes indium-phosphide.

3. The integrated circuit of claim 1, wherein the material is fusion-bonded to the semiconductor layer.

4. The integrated circuit of claim 1, wherein the first mirror and the second mirror each have a reflectivity at the wavelength in excess of 99%.

5. The integrated circuit of claim 1, wherein the hybrid laser includes a vertical-cavity surface-emitting laser (VCSEL).

6. The integrated circuit of claim 1, wherein the material includes regions with dopants proximate to edges of the material in the plane of the semiconductor layer that define a current aperture for charge carriers in the hybrid laser out of the plane of the semiconductor layer.

7. The integrated circuit of claim 1, further comprising a heater defined in the semiconductor layer, wherein the heater is configured to thermally tune the wavelength of the hybrid laser.

8. The integrated circuit of claim 1, wherein the optical waveguide is separated by a gap in the plane of the semiconductor layer that is defined by an edge of the region and an edge of the optical waveguide;
wherein the optical waveguide is configured to receive the optical signal from the hybrid laser via optical coupling across the gap; and
wherein the edge of the optical waveguide is proximate to the edge of the region so that, during operation of the hybrid laser, the optical signal is evanescently coupled to the optical waveguide.

9. A system, comprising:
a processor;
a memory storing a program module that is configured to be executed by the processor; and
an integrated circuit, wherein the integrated circuit includes:
a hybrid laser configured to provide an optical signal having a wavelength, wherein the hybrid laser includes:
a semiconductor layer including a region having a top surface and a bottom surface, wherein the semiconductor layer includes silicon;
a material having a top surface and a bottom surface, wherein the bottom surface of the material is disposed on the top surface of the region, wherein the material includes a III-V semiconductor,
and wherein the material has an optical gain at the wavelength that is larger than that of the semiconductor layer;
a first mirror disposed under the bottom surface of the region; and
a second mirror disposed on the top surface of the material, wherein the first mirror, the second mirror, include a stack, out of the plane of the semiconductor layer, of alternating materials having a first index of refraction and a second index of refraction that is higher than the first index of refraction, and wherein the first mirror, the second mirror, the region and the material define an optical cavity out of a plane of the semiconductor layer; and
an optical waveguide defined in the semiconductor layer;
a semiconductor substrate; and
a buried-oxide layer having a bottom surface and a top surface, wherein the bottom surface of the buried-oxide layer is disposed on top of the semiconductor substrate,
wherein the bottom surface of the semiconductor layer is disposed on the top surface of the buried-oxide layer, and
wherein the semiconductor substrate is removed under the region so that the first mirror is disposed on the bottom surface of the buried-oxide layer;
wherein the semiconductor substrate, the buried-oxide layer and the semiconductor layer constitute a silicon-on-insulator technology.

10. The system of claim 9, wherein the material includes indium-phosphide.

11. The system of claim 9, wherein the material is fusion-bonded to the semiconductor layer.

12. The system of claim 9, wherein the first mirror and the second mirror each have a reflectivity at the wavelength in excess of 99%.

13. The system of claim 9, wherein the hybrid laser includes a vertical-cavity surface-emitting laser (VCSEL).

14. The system of claim 9, wherein the material includes regions with dopants proximate to edges of the material in the plane of the semiconductor layer that define a current aperture for charge carriers in the hybrid laser out of the plane of the semiconductor layer.

15. The system of claim 9, further comprising a heater defined in the semiconductor layer, wherein the heater is configured to thermally tune the wavelength of the hybrid laser.

16. The system of claim 9, wherein the optical waveguide is separated by a gap in the plane of the semiconductor layer that is defined by an edge of the region and an edge of the optical waveguide;
wherein the optical waveguide is configured to receive the optical signal from the hybrid laser via optical coupling across the gap; and
wherein the edge of the optical waveguide is proximate to the edge of the region so that, during operation of the hybrid laser, the optical signal is evanescently coupled to the optical waveguide.

* * * * *

UNITED STATES PATENT AND TRADEMARK OFFICE
CERTIFICATE OF CORRECTION

PATENT NO. : 9,106,048 B2  
APPLICATION NO. : 13/764223  
DATED : August 11, 2015  
INVENTOR(S) : Krishnamoorthy et al.

Page 1 of 1

It is certified that error appears in the above-identified patent and that said Letters Patent is hereby corrected as shown below:

In the specification,

In column 6, line 20, after "particular" insert -- $\lambda$ --.

In column 6, line 30, delete "light," and insert -- light, $\lambda$ --, therefor.

In column 7, line 12, delete "tune" and insert -- tune $\lambda$ --, therefor.

In column 8, line 11, delete "usedm" and insert -- used --, therefor.

In column 8, line 18, delete "'cap;'" and insert -- 'cap'; --, therefor.

In column 9, line 38, delete "tuning" and insert -- tuning. --, therefor.

Signed and Sealed this  
First Day of March, 2016

Michelle K. Lee  
*Director of the United States Patent and Trademark Office*